United States Patent [19]
Kolm

[11] 3,988,680
[45] Oct. 26, 1976

[54] REMOTE TELEVISION CONTROL

[76] Inventor: Eric A. Kolm, c/o Signal Science, Inc., 140 Lowland St., Holliston, Mass. 01746

[22] Filed: Apr. 11, 1975

[21] Appl. No.: 567,410

Related U.S. Application Data

[63] Continuation-in-part of Ser. No. 476,438, June 5, 1974, abandoned, which is a continuation-in-part of Ser. No. 359,315, May 11, 1973, abandoned.

[52] U.S. Cl. ............................. 325/392; 74/10 A; 74/10.15; 178/DIG. 15; 192/142 A; 200/61.01; 325/393; 334/10

[51] Int. Cl.² ..................... H03J 1/22; G05G 1/10; F16C 1/16

[58] Field of Search ............... 74/10 A, 10.15, 126, 74/128, 141, 501 R, 502, 553; 178/DIG. 15; 192/142 A; 200/61.01; 310/23, 24; 318/16, 460; 325/390, 392, 393; 334/9, 10; 340/15, 147 R, 148, 171 R

[56] References Cited
UNITED STATES PATENTS

| | | | |
|---|---|---|---|
| 2,755,424 | 7/1956 | Papitto | 178/DIG. 15 |
| 2,769,344 | 11/1956 | Block | 74/10.15 |
| 2,816,259 | 12/1957 | Papitto | 178/DIG. 15 |
| 2,907,217 | 10/1959 | Siegel | 74/10.15 |
| 3,115,589 | 12/1963 | Bender | 334/10 |
| 3,325,593 | 6/1967 | Platt | 325/390 |
| 3,412,620 | 11/1968 | Bloom | 74/141 |
| 3,854,123 | 12/1974 | Banach | 325/393 |

*Primary Examiner*—Howard W. Britton
*Attorney, Agent, or Firm*—Cesari and McKenna

[57] ABSTRACT

A remote television control includes a hollow floating knob which is engaged on the television tuner shaft. Inside the knob is a torque-applying mechanism such as a unidirectional clutch or ratchet for imparting torque to the tuner shaft. A flexible coaxial force applying means extend between the torque-applying mechanism and a control including a solenoid which is actuated by means of an acoustical switch tuned to respond to an acoustical signal of a selected frequency emitted by a remote source. When the solenoid is actuated, it moves the force applying means which, in turn, reacts against the knob and activates the torque-applying mechanism inside the knob so that the tuner is rotated to change the channel of the television receiver. The control also includes a switch which is actuated when the knob is indexed to an unused channel position in order to turn the televison set off. Alternatively, the television set is turned on or off independently of the channel position of the tuner.

17 Claims, 12 Drawing Figures

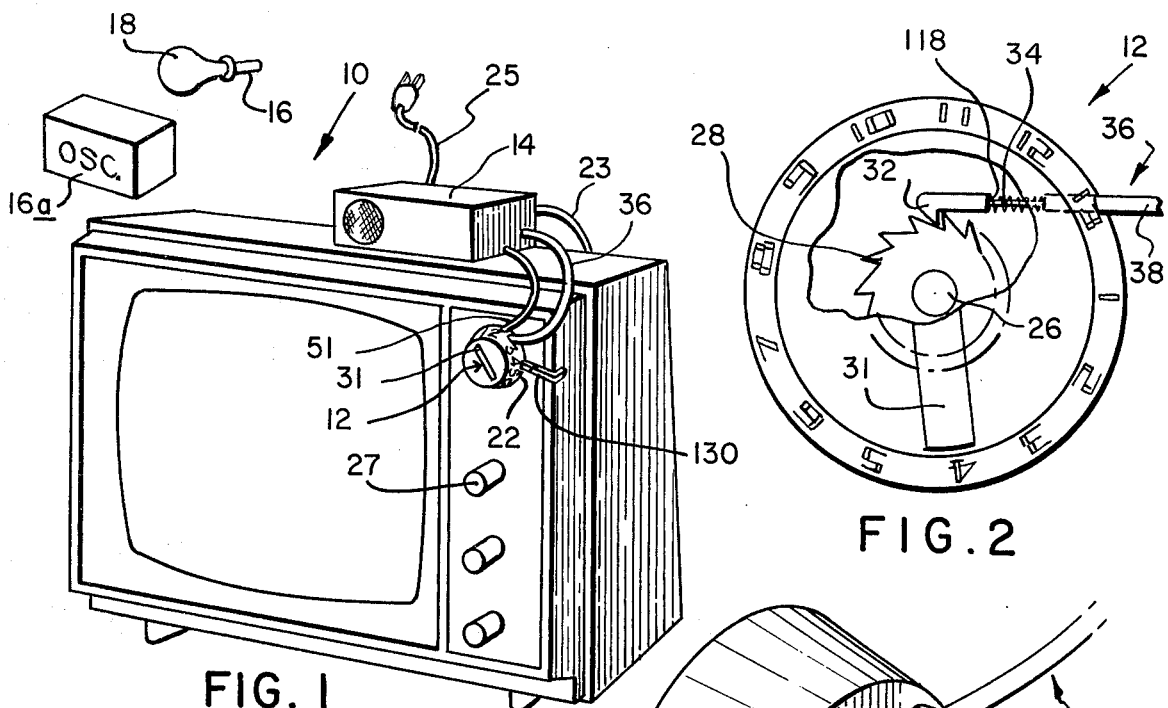
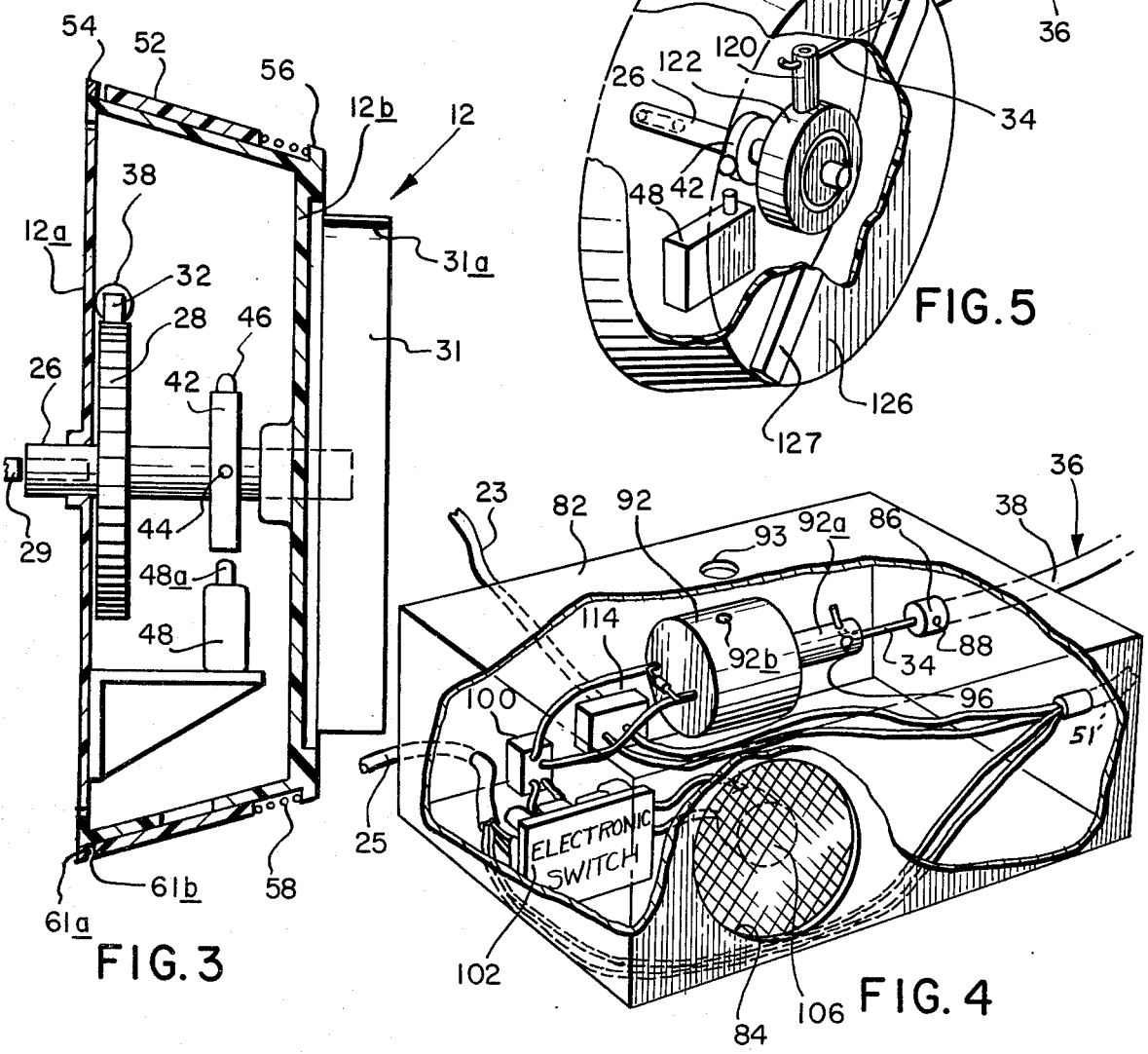

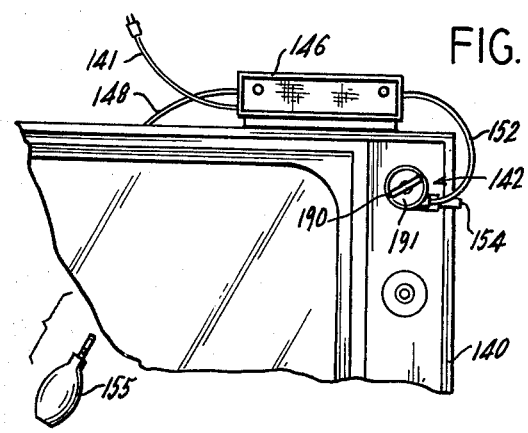
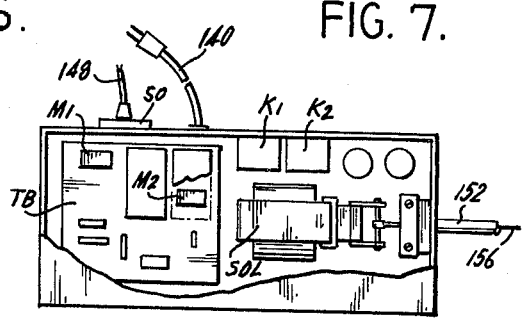
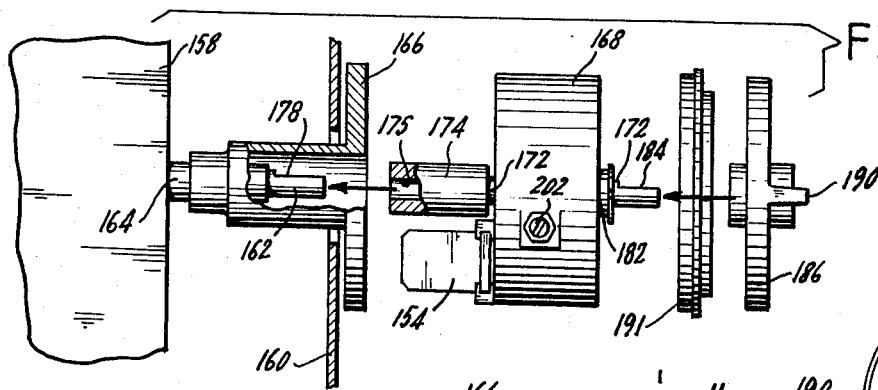
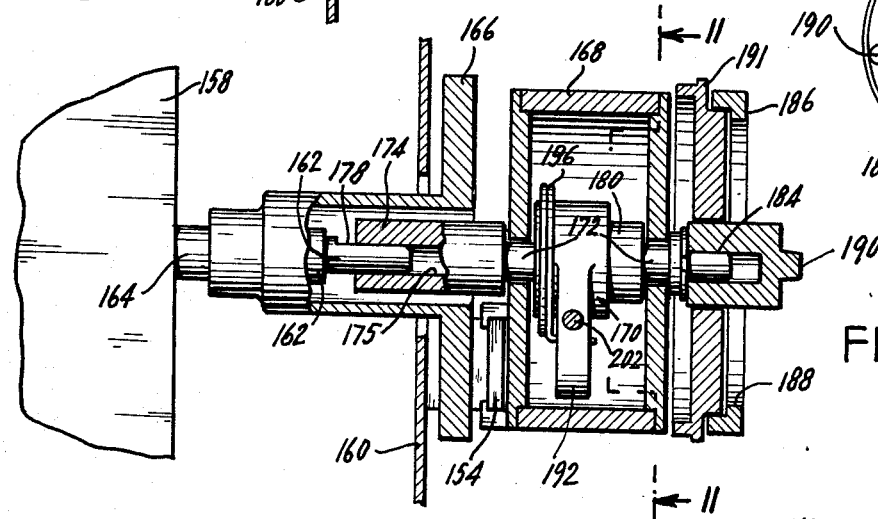
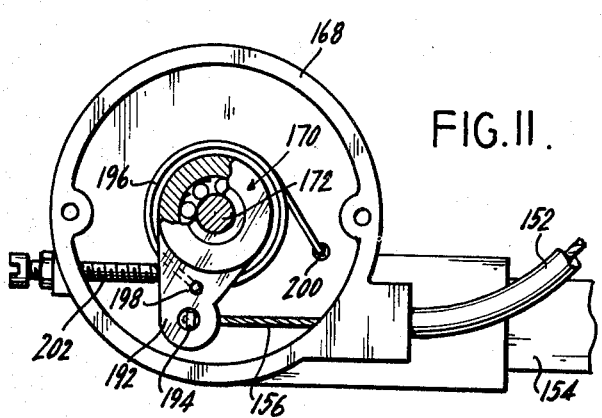
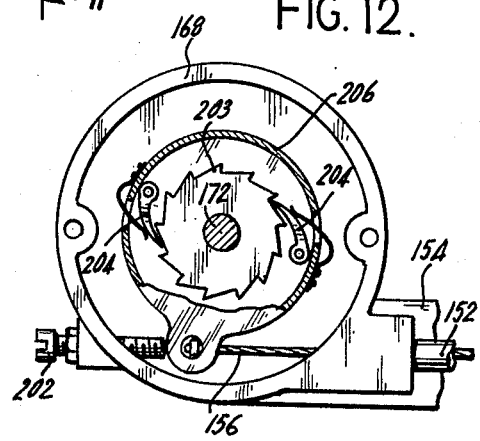

REMOTE TELEVISION CONTROL

RELATED APPLICATION

This application is a continuation-in-part of application Ser. No. 476,438 filed June 5, 1974, now abandoned, which is a continuation-in-part of application Ser. No. 359,315, filed on May 11, 1973, now abandoned.

BACKGROUND OF THE INVENTION

This invention relates to a remote television control, and more particularly, to a channel-changing control which responds to acoustical signals emitted from a remote location.

Conventional remote control systems for television sets are normally wired into the sets. Usually, it is not feasible to retrofit existing television sets not having a remote control capability with conventional remote control systems.

We are aware of one new type of acoustical control system which can be affixed to a standard television set so that the set can be controlled from a remote location. That system is disclosed in applicant's application Ser. No. 341,935, filed Mar. 16, 1973, entitled REMOTE TELEVISION CONTROL UNIT, now abandoned. That arrangement works quite satisfactorily. However, for practical reasons, it is desirable to provide a tuner shaft actuator remote from the tuner shaft and mechanically coupled thereto by a simple force transmitter requiring minimal connections to the shaft.

None of the prior television channel changing systems of which we are aware are adapted for retrofitting on almost any standard television receiver. The elaborate type of systems exemplified in U.S. Pat. Nos. 3,757,303 and 3,854,123 are wired right into the chassis of the television set. Those systems are specially designed for the particular sets in which they operate and the systems cannot be incorporated into other different television sets.

Other control mechanisms such as the one disclosed in U.S. Pat. No. 2,769,344 require the viewer to yank on a rip cord each time he wishes to change channels. In that type of system, the knob has to be screwed to the front of the television set housing. This not only makes it difficult to switch the control mechanism from set to set, it also disfigures the television set. An even worse disadvantage of that type of prior system stems from the fact that some means must be provided to anchor the television set to its supporting surface so that it will not be pulled over as the viewer changes channels. Such instability was not so much a problem in the early days of television when the TV receivers were very large and heavy floor models. However, that mechanism would be completely unsatisfactory for use on the small, lightweight, table model TV sets that are prevalent today. Unless the set was anchored, the viewer would pull it off the table everytime he tried to change channels. Furthermore, that prior control mechanism was simply a channel changer; the viewer still had to turn the set on and off manually.

Other prior remote television control systems have other disadvantages which militate against their wider use and acceptance. Some require bulky actuators connected to the tuner shaft. If there are any other television controls such as fine tuning, power or volume controls, in the vicinity of the tuner shaft as there invariably are, the actuator cannot be installed on that set.

Still other prior TV remote control mechanisms require cable connections between the television set and the viewer's position. U.S. Pat. No. 2,907,217 shows an arrangement having both of the aforesaid drawbacks.

Another major difficulty encountered when trying to design a universal television remote control system which can be accommodated to most existing television sets stems from the fact that not only are the tuner detent characteristics different from set to set, but they also vary from channel to channel within the same tuner due to aging, wear, etc. In other words, as a given tuner is indexed from channel to channel, different applied forces may be required to change between channels. The detent or spring affecting tuner travel between adjacent heavily used channels might be relatively worn or weak so that relatively little force is required to switch between those channels. On the other hand, the corresponding elements associated with relatively little-used channels may retain their original conditions so that more force is required to index through those channels. Any practical channel changer must be able to cope with these different torque requirements. And since there is no pattern to these requirements, a simple manual adjustment will not overcome that problem.

SUMMARY OF THE INVENTION

Accordingly, this invention aims to provide a remote control system for a television set which is relatively easy and economical to make.

Another object of the invention is to provide a system of this type which can be installed on most television sets by the owner himself without any special tools or other equipment.

A further object of the invention is to provide a remote television control which is compact enough so that it does not spoil the appearance of the television set or obstruct the picture.

Yet another object is to provide a television control which does not have to be permanently anchored to the television set.

A further object is to provide such a control which can control television sets of varying age and channel changer characteristics.

Still another object of the invention is to provide a remote television control which cannot only change channels, but also turn the set on and off.

Other objects will in part be obvious and will in part appear hereinafter. The invention accordingly comprises the features of construction, combination of elements and arrangement of parts which will be exemplified in the constructions hereinafter set forth and the scope of the invention will be indicated in the claims.

In a television receiver, the channel selection function is controlled by a tuner in the television receiver. The tuner in general has a tuner shaft which is rotatable in response to an applied torque of sufficient magnitude to overcome the torque resistance of the tuner to step the tuner between adjacent tuner positions for selecting successively different television channels. In accordance with one embodiment of this invention, a control system for controlling the functioning of a television receiver includes a torque-applying means adapted to be coupled to the tuner shaft and an acoustic switch-responsive means responsive to control signals in a predetermined frequency range. Flexible force-applying means coupled to the torque-applying means produce a force on the tuner shaft which overcomes the torque resistance thereof and steps the tuner between adjacent channel positions. Switch means are adapted to be connected to the electrical power control circuits in the television receiver and controls the flow of electrical power to the television receiver in response to a remotely-generated energy signal.

In a specific embodiment of the control system of the present invention, a replacement knob is engaged over the shaft of the rotary tuner in place of the original knob which is normally on the set. The replacement knob contains a torque-applying mechanism such as a unidirectional clutch or ratchet for imparting torque to the tuner shaft. The torque-applying mechanism is actuated to overcome the torque resistance of the tuner and to rotate the tuner shaft from one channel to the next by means of a flexible cable (e.g. of the type used to actuate bicycle caliper brakes). The cable extends from the knob to a housing placed on or near the television set where it is attached to a control solenoid inside the housing. When the solenoid is energized momentarily, it moves the cable which, in turn, moves the torque-applying mechanism inside the knob, with the result that the tuner is advanced through one channel position.

The solenoid is actuated by means of an acoustical switch also located inside the housing. The switch responds to acoustical control signals of a selected frequency which are emitted from a remote source, such as a dog whistle or electronic oscillator operated by the viewer. Upon the occurence of each such acoustical control signal, the switch pulses the solenoid so that the television tuner is stepped through one channel position.

The remote control system may also be arranged to control the electrical power to the television set. In one arrangement, the acoustical switch is operated to control the flow of power independently of the position of the tuner shaft. In another embodiment, a cam rotating with the tuner shaft inside the knob is arranged to actuate a switch inside the knob when the tuner is switched to or stepped to an unused channel. This switch, in turn, controls the circuit supplying power to the television set. When the tuner is stepped to this unused channel location, the television set is turned off.

To accommodate the present system to the different television models, provision is made for adjusting the length of the flexible cable, the stroke of the solenoid or the distance through which the cable is pulled so that the correct torque is applied to the tuner shaft just long enough to turn it through one channel position each time the solenoid is pulsed.

In the present system, the replacement knob contains a minimum number of parts. Therefore, it is quite small, being only on the order of two inches in diameter and one inch thick. Consequently, it can be installed on the tuner shafts of most, if not all, present-day television sets having rotary tuners. This is because the minimum diameter of such tuners is on the order of two inches. Therefore, no other control such as the power and volume controls can be located closer to the tuner shaft than about two and one-half inches which is quite enough room to accommodate the replacement knob. Furthermore, if the television set is the type having a fine tuning ring coaxially mounted on the tuner shaft, that ring is not obstructed by the present replacement knob any more than by the original equipment knob.

A further important feature of the present system stems from the fact that it is unnecessary and even undesirable to anchor the replacement knob to the television set housing in order to rotate the tuner shaft. This not only facilitates switching the control system from one television set to another, but also eliminates the need to deface the television set with securing screws, nails or the like.

It is unnecessary to anchor the replacement knob because each time the control system applies a force to develop the torque to rotate the tuner shaft, it also applies an equal and opposite force to the replacement knob so that there is no net force applied to the television set that might tend to move it or tip it over as is the case with some prior systems described above.

The fact that the replacement knob floats relative to the television set housing also contributes to a great extent to the ability of the present system to operate reliably despite variations in the torque requirements to change channels in the different television sets on which the system may be installed. More particularly, when the system is in its quiescent state, because the replacement knob floats relative to the TV set, the torque-applying means exerts no torque at all on the tuner shaft. Accordingly, the initial position of the tuner before each channel change is determined solely by the detent arrangement in the tuner itself, as would be the case if the replacement knob were not present.

Furthermore, the stroke of the force-applying means is adjusted so that up on each actuation of the solenoid, the torque-applying means turns the tuner shaft through an angle that is somewhat less than the angle to which it must be turned to reach the next channel position. Specifically, it turns the shaft through an angle that is only "beyond the point of no return" toward the next position, leaving it up to the tuner to travel the rest of the way to the next channel position under its own power. In other words, the present system does not drive the tuner to the next channel position. Rather, it rotates the tuner shaft only partway towards the next position, allowing the tuner detent arrangement to determine the ultimate rest position of the shaft.

Thus, the present system establishes neither the initial shaft position at the start of a channel change, nor the final shaft position after the change. Rather, both of those positions are determined by the tuner itself. Consequently, upon the occurrence of each acoustical signal, the system advances the tuner reliable one and only one channel position despite differences in the tuner detent characteristics between the old and new channel positions.

With all of the aforesaid advantages, the present television remote control system is fairly easy and inexpensive to make since, for the most part, it employs off-shelf parts which are readily available and easily assembled. Consequently, it should prove to be a very marketable appliance usable on most existing portable or console television sets and which can be installed in seconds by the average homeowner.

BRIEF DESCRIPTION OF THE DRAWINGS

For a fuller understanding of the nature and objects of the invention, reference should be had to the following detailed description taken in connection with the accompanying drawings, in which:

FIG. 1 is a perspective view of the subject remote television control system installed on a standard television set;

FIG. 2 is a view with parts broken away showing the knob portion of the control system in greater detail;

FIG. 3 is a view of the knob in medial section with parts shown in elevation;

FIG. 4 is a perspective view of the actuating portion of the control system with the external housing broken away;

FIG. 5 is a perspective view showing a different embodiment of the knob;

FIG. 6 is a partial front elevation view of a television receiver modified to include an acoustic switch arranged for providing remote channel selection control and electrical power control and showing an acoustic transmitter for transmitting a control signal;

FIG. 7 is a top plan view partially broken away showing the arrangement of the elements of the acoustic switch;

FIG. 8 is an exploded side elevation view partially broken away and partially in section of a tuner drive assembly for driving the tuner in the television receiver in response to acoustic signals;

FIG. 9 is a vertical sectional view of the tuner drive assembly, assembled and mounted on the shaft of the tuner in the television receiver;

FIG. 10 is a front elevation view of the assembled tuner drive assembly showing the front dial plate;

FIG. 11 is a view taken along the lines 11-11 of FIG. 9 and showing a unidirectional clutch in the tuner drive assembly arranged for rotation of the tuner shaft; and FIG. 12 is a graphical diagram illustrating the operation of the present system.

DESCRIPTION OF THE PREFERRED EMBODIMENT

Turning now to FIG. 1 of the drawings, a conventional television set shown generally at 10 is outfitted with the subject control system which consists of three basic parts, to wit: a replacement knob 12, an acoustically responsive actuator 14 and an acoustical generator illustrated as an ultrasonic dog whistle 16. The viewer changes the channel on set 10 by squeezing the bulb 18 attached to the whistle which forces air through the whistle, causing it to emit an acoustical signal. The whistle blast is in the ultrasonic range, e.g. 13 Khz., so that it is not a source of noise as far as the viewer is concerned. The acoustical signal is detected by actuating section 14 which then moves a flexible cable 36 connected to knob 12. The cable is actually connected to a torque-transmitting mechanism to be described inside the knob which is, in turn, secured to the tuner shaft of the television set. When the cable is so moved, the tuner shaft is rotated to its next channel position. Thus, by sounding successive blasts on whistle 16, the viewer can step the tuner through successive channels until he finds the program he likes. An electronic oscillator 16a may also be used in lieu of the whistle.

As seen from FIG. 1, knob 12 is quite small and unobtrusive so that it can be mounted on most present-day television sets without obstructing the picture or the fine tuning ring 22 usually found on sets of this type. The user installs the system simply by removing the original equipment tuner shaft knob and replacing it with knob 12. The knob 12 frictionally engages on the shaft and requires no special securement. Actuating section 14, on the other hand, is simply placed on top of the television set as shown in FIG. 1 or next to it. The power cord 23 of the television set is plugged into the back of section 14 and the power cord 25 to section 14 is plugged into the standard household power supply.

Normally, the power switch 27 of the television set is left in the ON position. The viewer turns the set off by emitting successive blasts on whistle 16 to step the tuner to an unused channel as will be described presently. When the tuner is stationed at this unused channel, power is interrupted between the power cords 23 and 25 so that set 10 is de-energized.

Turning now to FIGS. 2 and 3 of the drawings, knob 12 is hollow and is shaped more or less like a truncated cone. The knob contains shaft 26 which is rotatably mounted in the knob and whose end projects out through the rear wall 12a of the knob. Shaft 26 has an end recess so it can be engaged over the end of the tuner shaft 29 on the television set. It has the usual spring-loaded flat which presses against the flat of the tuner shaft 29 to prevent the knob from rotating relative to the shaft and to grip the shaft so that the knob cannot easily be pulled from the shaft. A handle 31 is engaged over the free end 26a of shaft 26 which projects out through the front wall 12b of the knob. Handle 31 allows the viewer to change channels manually if he likes.

Shaft 26 carries a ratchet gear 28 inside the knob. Desirably, gear 28 has 13 teeth corresponding to the 13 VHF channel positions found on most present-day television sets. The teeth of gear 28 are engaged by a driving pawl 32 which is attached to the central wire 34 of a flexible cable shown generally at 10. The sheath 38 of the cable, on the other hand, is secured to the knob 12. Thus, when the central wire 34 is pulled, the pawl 32 rotates gear 28 along with the tuner shaft.

As best seen in FIG. 3, a cam 42 is adjustably mounted on shaft 26 adjacent gear 28. A set screw 44 locks the cam to the shaft at the selected position of adjustment. Cam 42 has a boss 46 which depresses the actuating pin 48a of a microswitch 48 when the shaft 26 is turned so as to position the boss opposite the microswitch. Cam 42 is set so that when the tuner shaft is turned to an unused channel, boss 46 depresses the switch actuating pin 48a so that the switch opens. Cam 42 can be adjusted by set screw 44 so that the switch 48 can be opened when the tuner is turned to any channel since, in different localities, different ones of the thirteen channels may be unused channels. Switch 48 is connected by wire 51 (FIG. 1) to section 14 and interrupts power to set 10 when open.

Still referring to FIG. 3, a band 52 carrying the channel numbers encircles knob 12. This band is generally conical in shape and hugs the outside of the knob. The band 52 is slidable between a pair of circular flanges 54 and 56 at the front and rear of the knob. The band is biased toward flange 54 by a helical compression spring 58 acting between the band and flange 56. The band 52 can be rotated relative to the knob per se by pushing it inward and then turning it. In this way, the band can be set so that the number on knob 12 designated by the index 31a of handle 31 corresponds to the correct channel. This is done because the angular positions of the channels may vary from set to set. When the band is released, the spring causes the band to hug the knob. Also, teeth 61a projecting from flange 54 mesh with similar teeth 61b in the rear edge of the band 52 to prevent the band from turning relative to the knob once the band has been set as aforesaid.

Turn now to FIG. 4 which shows the actuating section 14 in greater detail. The components of section 14 are contained within a rectangular housing 82 having a screened aperture 84 in its front wall. The end of the cable sheath 36 is retained in a sleeve 86 secured to the side wall of housing 82. The sheath is held there by a set screw 88. The central wire 34 of the cable, on the other hand, extends into the housing and is secured to the armature 92a of a solenoid 92. The wire extends through a passage 94 in the armature and is retained there by means of a set screw 96.

Solenoid 92 is preferably an a.c. solenoid which is actuated by d.c. current pulses for reasons to be described later. In addition, the armature is desirably spring-loaded and provided with a shock absorbing cushion to minimize noise when it is actuated.

The effective length of the cable sheath 38 can be adjusted by loosening the set screw 88 and adjusting the distance between the end of wire 34 and the end of the sheath 38. Also, desirably, solenoid 92 includes a stroke adjustment 92b accessible through an opening 93 in housing 83 so that the throw of its armature can be changed. By adjusting the armature stroke and cable as aforesaid, the system can be arranged so that each time the solenoid is pulsed, it pulls the cable just enough to rotate the gear 28 and tuner shaft beyond the point of no return toward the next channel position. Such adjustments may have to be made from time to time to compensate for wear and aging of parts.

Solenoid 92 is pulsed by way of rectifier 100 which, in turn, is controlled by an acoustical switch 102. A piezo-electric transducer 106 positioned within the housing directly behind opening 84 senses the acoustical signals emitted by whistle 16 (FIG. 1) and converts these signals to equivalent electrical signals. The switch 102 amplifies the signals and uses them to momentarily close a relay in the switch to supply power from power cord 25 to rectifier 100 for a brief period, on the order of 1–2 seconds. Each time switch 102 relay closes, solenoid 92 is pulsed, with the result that its armature 92a retracts wire 34, causing the driving pawl 32 to rotate gear 28 one tooth position. A compression spring 118 (FIG. 2) reacting between pawl 32 and sheath 38 can be included to help advance the pawl to the next tooth. In this connection, we should mention that the cable should not be so stiff as to inhibit the motion of the knob.

The switch 48 in knob 12 is a double pole switch which is connected between the power cord 25 and a female plug 114 mounted in housing 82. The TV power cord 23 is connected to the female plug to couple power to the power control circuits in the receiver. Thus, the set receives power only when switch 48 is closed and electrical power flows to the power control circuits. This occurs at all positions of cam 42 except when the boss 46 depresses pin 48a (FIG. 3) when the tuner is stationed at the unused channel selected as described above to turn the set off. Of course, switch 102 still receives power via cord 25 so that the TV set can be turned on again by stepping the tuner to a different channel.

If desired, switch 48 can be used to control a relay in section 14 which, in turn, controls the power to the TV set 10. In some cases, this may be done so that only low voltage has to be conducted to knob 12.

The acoustical switch may be any one of a variety of such switches. One suitable type has been sold for several years by Sonus Corporation and its successor company, Signal Science, Inc., under the name Whistle Switch. A preferred type is disclosed in application Ser. No. 341,935, filed Mar. 16, 1973, entitled REMOTE TV CONTROL UNIT, now abandoned, owned by the assignee of the present application and the description therein is incorporated by reference herein.

Referring again to FIGS. 2 and 3, it is important to appreciate that the knob 12 is not secured to the housing of the television set in any way; it floats freely. Still, the system is able to impart torque to the shaft 29. This is because, each time the solenoid 92 is actuated to jerk the cable wire 34, an equal and opposite force is exerted on the knob by the cable sheath connected between housing 82 and the knob 12. Consequently, there is no net translational force applied to the knob by the cable that might tend to move the television set or tip it over. Consequently, the present remote control can be installed on even the very lightweight portable television sets without having to anchor the set or, indeed, the housing 82.

Since the knob 12 floats, relative to the housing, there is normally no torque applied to the tuner shaft 29 so that it is always seated by its own detent arrangement in a channel position as it would be if the replacement knob 12 were not there. Consequently, the force-applying means commerce its stroke from substantially the same position during each cycle of the system. Furthermore, for best results the length of the stroke is adjusted by means of the stroke adjustment 92b mentioned above or adjustment screw 202 (FIG. 11) so that the torque-applying means turns the tuner shaft only through an angle "beyond the point of no return" toward the next channel, allowing the tuner to drop into the next channel under the influence of its own detent mechanism. In this connection it will be appreciated that the unidirectional torque-applying means permits the tuner shaft to continue rotating of its own accord toward the next channel position, even though the force-applying means has completed its stroke.

With this arrangement, then, both the initial and final positions of the tuner shaft are determined solely by the tuner itself and not by the remote control mechanism. As a result, differences in tuner characteristics tend not to affect the channel changing reliability to the present system. To illustrate this feature, five channels (i.e. channels 2 to 6) are shown graphically by the waveform W in FIG. 12. The waveform valleys correspond to successive channel positions of the tuner and are numbered accordingly. Each of these valleys is the same distance from its neighbors since the angles between channel positions are equal. The waveform peaks represent the resistances presented by the tuner's detent mechanism when switching between the successive channels 2 to 6. The amplitudes and shapes of these peaks reflect different detent characteristics caused by wear, flats, aging, etc. The higher the peak, the greater the applied torque required to switch to the next channel.

In the preferred embodiment of the present system the stroke of the force-applying means is adjusted when the control is initially installed on a particular television set to suit the angle between channels on that set and so that, when actuated, the torque-applying means only moves the tuner shaft partway towards the next channel position. Specifically, the system is adjusted so that it turns the shaft through an angle that takes it, say, to a point D just beyond the "point of no return" represented by the top of each peak in the waveform W. A typical stroke is represented by the vectors S in FIG. 12. The successive vectors S are all of equal length as are the successive strokes of the force-applying means, yet each vector terminates at a point D on the backside of the waveform peak in question. Thus, when switching through channels 2 to 6 the torque applied by the torque-applying means terminates at each point D so that the tuner is always carried, but only by its own internal mechanism, to each successive channel position; yet, it has insufficient inertia to skip a channel even if its detent mechanism is worn, as it is between channels 3 and 4. It should be mentioned that it is a relatively rare exception that a tuner is so defective that a single stroke length S cannot be found that will drive the tuner beyond the "points of no return" between all channel positions despite differences in the detent characteristics between channels as represented by the differently shaped peaks in waveform W.

Furthermore, since the torque-applying means is not intended to rotate the shaft the entire angular distance to each succeeding channel position, some play can be tolerated in the torque-applying means and force-applying means without spoiling the reliability of the system.

In contrast to the above, a conventional remote control which is intended to drive a tuner shaft all the way from the channel 2 position to the channel 3 position in FIG. 12, may very well cause the tuner to overshoot the channel 3 position and travel to the channel 4 position because of the worn detent between channels 3 and 4 represented by the low profile peak between those locations in waveform W. A subsequent actuation of the conventional remote control might cause the tuner (now set on channel 4) to overshoot the channel 5 position and become "hung up" between channels 5 and 6 due to a low flat in the detent there represented by the short, flat-topped peak in the waveform W between locations 5 and 6.

The mechanism contained within knob 12 for imparting rotary motion to the tuner shaft 29 may assume a variety of forms. FIG. 5 illustrates an alternative mechanism consisting of a lever 120 connected to the input of a one-way clutch 122. The output of the clutch is secured to shaft 26 which is arranged to be engaged over the tuner shaft 29 as described above. As with the FIG. 3 embodiment, a cam 42 is mounted on the shaft and arranged to actuate a microswitch 48. All of these components are contained with a hollow knob 126. This knob can be more or less the same as the one depicted in FIGS. 2 and 3. The central wire 34 of the flexible cable is secured to the free end of lever 120 and when this wire is pulled by solenoid 92 (FIG. 4), the lever turns the shaft 26 clockwise via the one-way clutch 122. A suitable clutch 122 is manufactured by Torrington Company, Torrington, Conn. and is identified by Model No. RE 0040708.

The shaft 26 extends through clutch 122 and through an opening in the front face 126a of the knob where it connects with a handle 127. Thus, the viewer can rotate the handle counterclockwise and so change channels manually if he chooses.

Instead of having the on/off switch 48 and channel indicator built into knob 12, it may be desirable to have these elements in the actuating section 14. In other words, the channel indicating dial can be affixed to the end of a shaft rotatably mounted on the front wall of housing 82. In this event, the other end of the shaft inside the housing carries a ratchet gear or clutch and cam similar to gear 28 or clutch 122 and cam 43. Also, a microswitch like switch 48 is positioned adjacent the cam. This shaft and the indicating dial are turned by means of a drive pawl of lever similar to pawl 32 or lever 120 also attached to wire 34 inside the housing or by a separate flexible cable 36 extending between the pawl or lever in the housing and a driven pawl or lever engaging the ratchet gear 28 or clutch 122 in the knob 12. Thus, each time the solenoid 92 pulsed, the indicating dial will be moved through one numbered position. This arrangement has the advantage of enabling the user to more readily select and adjust the "off" channel because he has easy access to housing 82. It also removes all electrical elements from the knob and confines them to the remote actuator power source, thus resulting in an electrically safer and cheaper knob.

Another arrangement for remote television control is shown in FIGS. 6–11. Referring to FIGS. 6 and 7 there is shown a partial front view of a television receiver, designated generally by reference numeral 140, modified with an acoustic remote control device generally designated by reference numeral 142 and including tuner drive assembly 144 and acoustic switch 146 positioned on top of the receiver. As shown, a power cable 148 from the television receiver is coupled to the rear of the acoustic switch 146 and is connected to outlet SO. The acoustic switch has a power cable 141 which is adapted to be coupled to a source of electrical power, such as a wall outlet. Coupled between acoustic switch 146 and tuner drive assembly 144 is flexible cable 152. Also shown in FIG. 6 is an acoustic transmitter, 155, for producing acoustic signals in a predetermined range of frequencies.

FIG. 7 shows a simplified diagrammatic representation of the arrangement of the elements of the acoustic switch, 146. As shown, the circuit includes two tuned transducers M1, M2 mounted on terminal board TB along with the other electrical components, relays K1, K2 and solenoid SOL, arranged with its armature coupled to the inner cable 156 of cable 152. Greater detail of the acoustic switch can be found by reference to copending application Ser. No. 476,439 entitled ACOUSTIC SWITCH, filed on June 5, 1974 by Eric Kolm and which is expressly incorporated by reference herein.

FIGS. 8 and 9 show in detail the drive assembly for channel selection in the television receiver. A television tuner, partially shown and designated by reference numeral 158, is mounted in the receiver which has a front plate, partially shown, and designated by reference numeral 160. Extending forwardly from the tuner is a shaft 162 which is rotatably mounted with respect to the tuner and is rotated for changing the television channels as is well known and has been described above. Rotatably mounted with respect to shaft 162 is a concentric shaft 164, coupled to the fine tuning circuits in tuner 158. A fine tuning knob 166 is mounted on the fine tuning shaft to provide fine tuning capability for the receiver, as is well known. To this point, there has been described a conventional arrangement for tuners in television receivers. The conventional receiver has a dial such as shown in FIG. 10, positioned on the forward end of shaft 162 and the television set is tuned by rotation of the knob which, in turn, rotates shaft 162 to step the tuner between channels.

In accordance with a feature of the invention, a tuner drive mechanism is interposed between shaft 162 and the dial, for remote control of the channel changing function of the receiver under the control of the acoustic switch. The tuner drive assembly includes a hollow cylindrical housing 168, having mounted therein a torque-applying element, generally designated as reference numeral 170. The torque-applying element is mounted on shaft 172 which extends rearwardly through a hole in the rear wall of housing 168. Mounted on the rearward end of shaft 172 is a larger diameter shaft 174 having a central bore 175 adapted to frictionally engage the forward end of shaft 162 at key 178. Shaft 172 also extends forwardly of torque-applying element 170 through a hole in the forward wall of housing 168 and has spacers 180 and 182 mounted thereon. The forward end of shaft 172 is cut away forming a key 184 similar to key 178 of shaft 162. A dial (shown in from view in FIG. 10) including a front plate 186, a transparent window 188, a turning bar 190 and rear plate 191, frictionally engaging the front plate, on which is imprinted channel numbers, is mounted on the forward end of shaft 172. The inner plate is rotatably mounted with respect to the outer plate so that after the dial is placed on the television receiver, the inner plate can be aligned with an indicator on the receiver to show the channel to which the receiver is tuned. Thereafter, as the tuner is rotated, the correct channel will be indicated automatically.

Referring to FIGS. 4 and 11, torque-applying element 170 is in the form of a unidirectional clutch 192. The clutch is mounted on shaft 172 and has one end of cable 156 coupled to its outer leg at 194. The other end of cable 156 is attached to the movable arm of solenoid SOL. Coiled spring 196 wound around the outer rearward surface of clutch 192 has one end secured to clutch 192 at point 198 and the other end secured to housing 168 at point 200 to urge clutch 192 to rotate in a clockwise direction. It can now be seen that when solenoid SOL is activated, a force is applied to the clutch through cable 156 which pulls the end of the unidirectional clutch 192 to the right, producing torque on shaft 172 and tuner shaft 162. Sufficient torque is applied to overcome the torque resistance of the tuner and the tuner steps to the next television channel. Since the distance that shaft 162 must be rotated to effect a change in channel may differ for different tuners, adjustment screw 202 is provided to set the leftmost position of the end of the clutch. When force is released from cable 156, spring 196 urges clutch 192 clockwise back to its original position into contact with adjustment screw 202.

Operation of this embodiment of the remote television receiver control will not be apparent. The tuner drive assembly is positioned in the receiver with shaft 162 engaging the tuner shaft and the cable coupled to the solenoid in the acoustic switch. The power cable from the receiver is connected with the outlet SO in the acoustic switch and the plug PL of the acoustic switch is inserted into a conventional source of AC power as a wall outlet. As explained in detail in my copending application filed herewith an referenced above, upon a first acoustic signal being transmitted from transmitter 155, relay K1 in the acoustic switch is activated and power is applied to the power control circuits in the television receiver through outlet SO to turn the receiver "on." A subsequent transmitted acoustic signal activates relay K2 on the acoustic switch for a predetermined period of time during which solenoid SOL is activated. Activation of the solenoid produces a force on cable 156 which activates the torque-applying element to apply torque to shaft 162 sufficient to cause the turner to step to the next channel. After the predetermined time interval, relay K2 is deactivated which deactivates the solenoid SOL; releasing the force on cable 156 and permitting the clutch to freely rotate back to its starting position. Subsequent acoustic signals produce further stepping of the tuner in the receiver. When two acoustic signals separated in time by less than the predetermined time during which relay K1 is activated are transmitted, relay K1 is deactivated and electrical power is removed from the television receiver.

Of course, the present system can be made responsive to light energy instead of sound. This simply involves substituting light-sensitive detectors for the acoustical detectors $M_1$ and $M_2$ and using a flashlight instead of the whistle 155 to control the TV set.

Also, the force-applying means can be another type of arrangement that will apply equal and opposite forces to the TV set as do the wire and sheath of cable 32. For example, they can be a pair of wires captured in a sheath or a hydraulic line with the fluid being equivalent to the cable wire and the tube being equivalent to the cable sheath. In this event, of course, small pistons would be located at the opposite ends of the line to transmit the force between the solenoid and the torque-applying means. Another embodiment might employ a flexible rotary cable like a speedometer cable to apply torque to the tuner shaft and reactive torque to the TV set with a rack and pinion mechanism between the solenoid and the cable.

As noted above, the replacement knob cannot be any larger than about two inches in diameter. Otherwise, it will not fit on many TV sets which have another control knob within about 2½ inches from the tuner shaft. On the other hand, the knob cannot be much smaller than that because the torque applied to the shaft is a function of the lever arm length of the torque-applying means and the force applied thereto by the solenoid via the cable. If the lever arm is much less than two inches, a larger solenoid would be required that would, when pulsed, draw a relatively large current, on the order of 6 amps. Bear in mind, also, that some color TV sets draw that much current. Thus, if there is any other appliance on that same circuit, such as an antenna rotater, the usual 15 amp household circuit would blow a fuse when the viewer changes channels.

Even with a two-inch lever arm, a standard DC solenoid with the requisite pulling force may draw excessive current. Therefore, preferably a standard a.c. solenoid is employed, but it is actuated with d.c. pulses to obtain maximum pulling force with minimum current, e.g. on the other of 3 amps.

It will thus be seen that the objects set forth above, among those made apparent from the preceding description, are efficiently attained and, since certain changes may be made in the above construction without departing from the scope of the invention, it is intended that all matter contained in the above description, or shown in the accompanying drawings, be interpreted as illustrative and not in a limiting sense.

It is also to be understood that the following claims are intended to cover all of the generic and specific features of the invention described.

I claim:

1. An external remote control attachment for a TV set of the type having a case and a rotary tuner shaft with an end accessible through the case, said attachment comprising
   A. torque-applying means adapted to be connected to the accessible end of the tuner shaft,
   B. a housing spaced appreciably from the tuner shaft, C. actuatable moving means supported inside the housing, D. first force-transmitting means mechanically connected between the moving means and the torque-applying means so that when the moving means is actuated, it moves said first means and thereby the torque-applying means so that the latter steps the tuner toward an adjacent channel position, E. second force-transmitting means connected to the housing and extending substantially to the TV set for applying a reactive force to the TV set which is substantially equal and opposite to a force applied by the moving means to the torque-applying means so that there is substantially no net force applied between the housing and the TV set when the moving means is actuated, and F. means responsive to remote energy signals for actuating the moving means.

2. The attachment defined in claim 1 and further including means for controlling the angle through which the torque applying means turns the tuner shaft so that the tuner shaft is only turned toward the adjacent channel position beyond the point of no return whereby the tuner moves to the adjacent position substantially under its own power so that the new position of the tuner is determined substantially solely by the tuner characteristics.

3. The attachment defined in claim 1 wherein
A. said first and second force-transmitting means comprise two elements of a flexible plural element cable, and
B. the torque-applying means comprise a unidirectional drive whose input member is connected to the adjacent end of one of the cable elements and whose output member is arranged to be coupled to the accessible end of the tuner shaft.

4. The attachment defined in claim 1 and further including means coupling said energy signal responsive means and said TV set and operable in response to said energy signals for controlling the flow of electrical power to the TV set.

5. The attachment defined in claim 1 wherein
A. the moving means comprise an a.c. solenoid having its armature connected to the first means, and
B. the actuating means apply d.c. pulses to the solenoid when they respond to said remote signals.

6. The attachment defined in claim 1
A. further including a relatively small enclosure for the torque-applying means, and
B. wherein the end of said second means adjacent the TV set is connected to the enclosure, said enclosure having appreciable rotative play relative to the TV set case so that, in its quiescent state, the attachment exerts no appreciable torque on the tuner shaft whereby the initial position of said tuner is determined substantially solely by the tuner characteristics.

7. The attachment defined in claim 6 wherein the enclosure is no larger than about two inches in any direction perpendicular to the tuner shaft.

8. An external remote control attachment for a TV set of the type having a case and a rotary tuner shaft with an end accessible through the case, said attachment comprising
A. torque-applying means adapted to be connected to the accessible end of the tuner shaft,
B. a housing spaced appreciably from the tuner shaft, C. actuatable moving means supported inside the housing, D. first force-transmitting means mechanically connected between the moving means and the torque-applying means so that when the moving means actuated, they move said first means and thereby the torque-applying means so that the latter step the tuner toward an adjacent channel position, and E. means for controlling the angle through which the torque applying means turn the tuner shaft so that the tuner shaft is only turned toward the adjacent channel position beyond the point of no return whereby the tuner moves to the adjacent position substantially under its own power so that the new position of the tuner is determined substantially solely by the tuner characteristics.

9. The attachment defined in claim 8 and further including means coupling said energy signal responsive means and said TV set and operable in response to said energy signals for controlling the flow of electrical power to the TV set.

10. A remote control system for a TV set having a case and a rotary tuner shaft with an end accessible through the case comprising
A. a relatively small hollow knob for attachment to the accessible end of the tuner shaft,
B. torque-applying means rotatably mounted inside the knob, said torque-applying means being arranged to engage the end of the tuner shaft so as to be rotatively fixed thereto,
C. a housing spaced from the knob outside the TV set,
D. moving means supported inside the housing,
E. force-transmitting means mechanically connected between the moving means and the torque-applying means,
F. means responsive to energy signals from a remote location for actuating the moving means to step a tuner to which the torque-applying means is engaged toward an adjacent channel position,
G. switch means adapted to be connected to the power control circuits of said TV set for controlling the flow of electrical power to the set, and
H. means responsive to remotely generated energy signals for operating said switch means for turning the set on and off.

11. The system defined in claim 10 wherein the actuating and turning means respond to acoustical signals of a selected frequency.

12. The system defined in claim 10 wherein the actuating and turning means respond to light signals.

13. The system defined in claim 10 wherein said knob has appreciable rotative play relative to the TV set case so that, in its quiescent state, with the torque-applying means engaging a tuner shaft, the system applies no torque to the tuner shaft.

14. The system defined in claim 10 and further including means for controlling the angle through which the torque-applying means turn the tuner shaft so that the tuner shaft is only turned toward the adjacent channel position beyond the point of no return whereby the tuner moves to the adjacent position substantially under its own power so that the new position of the tuner is determined substantially solely by the tuner characteristics.

15. The system defined in claim 10 wherein the knob is no longer than two inches in any direction perpendicular to a tuner shaft to which the torque-applying means is engaged.

16. The system defined in claim 10 wherein
A. the torque-applying means comprise a unidirectional drive, and
B. the force and reactive force-transmitting means comprise the two elements of a flexible coaxial cable.

17. The system defined in claim 16 wherein the moving means comprise an electrically operated solenoid and means for connecting the solenoid armature to the adjacent end of one of the cable elements.

* * * * *